United States Patent [19]

Miyake

[11] Patent Number: 5,552,630
[45] Date of Patent: Sep. 3, 1996

[54] THIN FILM TRANSISTOR HAVING METALLIC LIGHT SHIELD

[75] Inventor: Hiroyuki Miyake, Kanagawa, Japan

[73] Assignee: Fuji Xerox Co., Ltd., Tokyo, Japan

[21] Appl. No.: 987,073

[22] Filed: Dec. 7, 1992

Related U.S. Application Data

[63] Continuation of Ser. No. 683,774, Apr. 11, 1991, abandoned.

[30] Foreign Application Priority Data

Apr. 13, 1990 [JP] Japan ........................................ 2-96542

[51] Int. Cl.⁶ .................... H01L 31/0232; H01L 29/04; H01L 31/036; H01L 23/552
[52] U.S. Cl. .................. 257/435; 257/53; 257/72; 257/659
[58] Field of Search ........................ 357/23.7, 4; 257/53, 257/72, 435, 659

[56] References Cited

U.S. PATENT DOCUMENTS

| | | | |
|---|---|---|---|
| 4,618,873 | 10/1986 | Sasano et al. | 357/23.7 |
| 4,646,424 | 3/1987 | Parks et al. | 357/23.7 |
| 4,759,610 | 7/1988 | Yanagisawa | 357/23.7 |
| 4,984,033 | 1/1991 | Ishizu et al. | 357/23.7 |
| 4,990,981 | 2/1991 | Tanaka et al. | 357/23.7 |
| 5,041,888 | 8/1991 | Possin et al. | 357/4 |
| 5,136,358 | 8/1992 | Sakai et al. | 257/659 |
| 5,160,835 | 11/1992 | Yagyu | 257/659 |

FOREIGN PATENT DOCUMENTS

| | | | |
|---|---|---|---|
| 60-66470 | 4/1985 | Japan | 357/4 |
| 61-32471 | 2/1986 | Japan | 357/23.7 |
| 61-244068 | 10/1986 | Japan | 357/4 |
| 1-268062 | 10/1989 | Japan | 357/23.7 |

*Primary Examiner*—Steven H. Loke
*Attorney, Agent, or Firm*—Finnegan, Henderson, Farabow, Garrett & Dunner, L.L.P.

[57] ABSTRACT

A thin film transistor includes an insulating substrate, a gate electrode formed on the substrate, a first insulating layer formed on the gate electrode, a semiconductor layer formed on the first insulating layer over the gate electrode, a second insulating layer formed on the semiconductor layer over the gate electrode, a drain electrode having a predetermined width formed on the semiconductor layer and overlapping a side portion of the second insulating layer, a source electrode formed on the semiconductor layer opposing the drain electrode and overlapping another side portion of the second insulating layer, a third insulating layer formed on the source and the drain electrodes width, and a metallic layer formed on the third insulating layer having a width greater than the predetermined width and covering a predetermined length of the drain electrode.

8 Claims, 4 Drawing Sheets

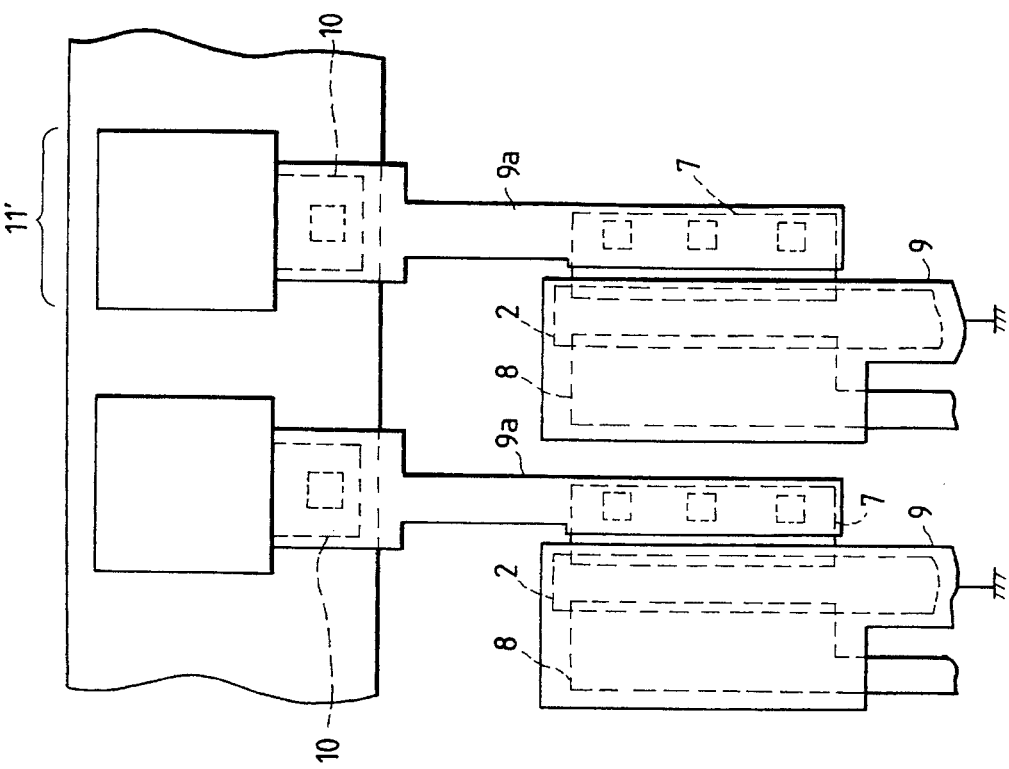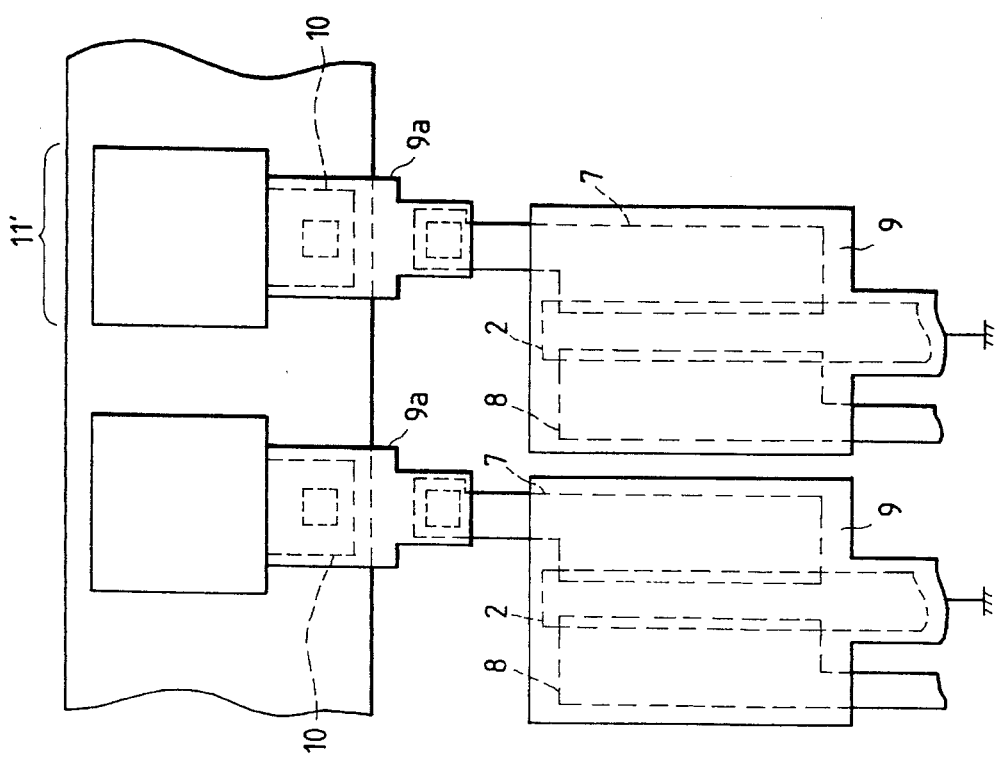

THIN FILM TRANSISTOR HAVING
METALLIC LIGHT SHIELD

This application is a continuation of application Ser. No. 07/683,774, filed Apr. 11, 1991, now abandoned.

BACKGROUND OF THE INVENTION

1. Field of the Invention

The invention relates to thin film transistors (TFT), and more particularly to a thin film transistor used as a switching element in an electric charge transfer section for outputting an electric charge generated by photoelectric conversion elements such as high-resolution image sensors.

2. Description of the Related Art

The use of thin film transistors in the electric charge transfer section of image sensors is known in the art. Many conventional image sensors, especially contact type image sensors, are TFT-driven image sensors which employ thin film transistor switching elements. In the conventional TFT-driven image sensor, image data, typically from a document, is divided into a multiplicity of pixels (photoelectric conversion elements) and projected on a one-to-one correspondence basis. The projected image is converted into electric signals, that is, an electric charge is generated by respective photoelectric conversion elements and temporarily stored at interline capacitors for a group of lines forming a predetermined block. The stored electric charges are then sequentially read as electric signals at speeds ranging from several hundred KHz to several MHz. TFT operation allows conventional TFT-driven image sensors to read image data with a single drive IC, thereby contributing to a reduction in the number of drive ICs required by the image sensor.

As shown, for example, in FIG. 7, a TFT image sensor includes: a line-like photoelectric conversion element array 11 whose length is substantially the same as the length of a document; an electric charge transfer section 12 consisting of a plurality of thin film transistors Ti,j (i=1 to N, j=1 to n) corresponding on a one-to-one basis to the respective photoelectric conversion elements 11'; and a group of signal lines 13.

The photoelectric conversion element array 11 consists of N blocks of photoelectric conversion elements. Each block includes n photoelectric conversion elements 11' and can be equivalently represented as a plurality of photodiodes PDi,j (i=1 to N, j=1 to n). Each photoelectric conversion element 11' is connected to the drain electrode of a corresponding thin film transistor Ti,j. The source electrode of each thin film transistor Ti,j is connected to one of n common signal lines 14 through a matrixed line group 13. The gate electrode of each thin film transistor Ti,j is connected to a gate pulse generating circuit (not shown). The photoelectric charge generated at each photoelectric conversion element 11' is temporarily stored in a parasitic capacitor formed in each photoelectric conversion element and in an overlap capacitor formed between the drain and gate of each thin film transistor. For each block, the stored charge is sequentially transferred to and thereafter stored in the interline capacitors Ci (i=1 to n) of the line group 13. Charge transfer is accomplished using thin film transistor Ti,j as electric charge transfer switches.

Specifically, a gate pulse $\phi$G1 from gate pulse generating circuit turns on thin film transistors T1,1 to T1,n, thereby causing the photoelectric charge previously generated and stored in each photoelectric conversion element 11' in the first block to be transferred to, and stored in, a respective interline capacitor Ci. The electric charge stored in each interline capacitor Ci changes the potential of the respective common signal line 14. This changed potential is provided at output line 16 by sequentially turning on an analog switch SWi (i=1 to n) within a drive IC 15. The thin film transistors T2,1–T2,n to TN,1–TN,n of the second to Nth blocks are similarly turned on by gate pulses $\phi$G2 to $\phi$GN, whereby the electric charge from the respective photoelectric conversion elements in each block are similarly transferred. By sequentially reading the transferred electric charge, image signals corresponding to a single line in a main scanning direction of the document are obtained. The above operation is repeated by moving the document with document forwarding means such as rollers (not shown), thereby allowing the image signals of the entire document to be obtained. See Japanese Patent Unexamined Publications Nos. 9358/1988 and 67772/1988.

The structure of a TFT typically used in the above-described conventional image sensor and a method of preparing the TFT will be described. As shown in FIG. 5, which is a plan view, and FIG. 6, which is a sectional view, of a portion taken along a line B—B' in FIG. 5, the TFT used in the conventional image sensor has a reverse staggered structure.

Specifically, the TFT is formed by sequentially depositing on an insulating substrate 1 made of, e.g., glass or ceramic, a chromium (Cr) layer serving as a gate electrode 2, a silicon nitride (SiNx) film serving as a gate insulating layer 3, an amorphous silicon hydride (a-Si:H) layer serving as a semiconductor activated layer 4, a silicon nitride (SiNx) film serving as a channel protection insulating film 5 provided over the gate electrode 2, an $n^+$ hydride amorphous silicon ($n_+$ a-Si:H) layer serving as an ohmic contact layer 6, a chromium (Cr) layer serving as a drain electrode 7 and a source electrode 8, additional depositions of a polyimide insulating layer on the Cr layer, and a line layer 9a or an aluminum (Al) layer 9 on the channel protection film 5 to shield the a-Si:H layer.

Al layer 9, which shields the a-Si:H layer, is provided to prevent light from provoking photoelectric conversion. That is, Al layer 9 prevents light from traveling via channel protection film 5 and being injected into a-Si:H layer 4. Line 9a from transparent electrode 10 of photoelectric conversion element 11' is connected to drain electrode 7. Ohmic contact layer 6 is separated into partial layer 6a, which is in contact with drain electrode 7, and partial layer 6b, which is in contact with source electrode 8. The Cr layer serving as drain electrode 7 and source electrode 8 is similarly separated so as to cover ohmic contact layer portions 6a and 6b. This Cr layer serves not only to prevent Al line layers from being damaged during vapor deposition or sputtering but also to maintain the $N^+$ a-Si:H property of ohmic contact layer 6.

A conventional method of preparing the TFT will be described with reference to FIGS. 5 and 6. A Cr layer serving as the gate electrode 2 is deposited on an insulated substrate 1 and subjected to photolithography to pattern the gate electrode 2 into a predetermined profile. A silicon nitride (SiNx) film serving as an insulating layer (gate insulating layer 3) for the gate electrode 2 is deposited. Next, an amorphous silicon hydride (a-Si:H) film serving as the semiconductor activated layer 4 is deposited on the gate insulating layer 3 by a plasma chemical vapor deposition (P-CVD) method. A silicon nitride (SiNx) insulating film (channel protection insulating film 5) is then deposited. The SiNx insulating film is patterned by photolithography to profile the channel protection insulating film 5. On the profiled channel protection insulating film 5, an n⁺ amorphous silicon hydride (n⁺ a-Si:H) serving as the ohmic contact layer 6 is deposited by the P-CVD method. The Cr layer to be formed into drain electrode 7 and source electrode 8 is deposited by DC magnetron sputtering, and a photoresist is applied to the surface of the Cr layer. The Cr layer is then patterned by a photolithographic process and an etching process such that an opening is formed over channel protecting insulating film 5. The Cr layer is then further etched to form drain electrode 7 and source electrode 8. Next, the Cr layer thus far processed is etched using a gas mixture of $HF_4$ and $O_2$. Finally, the Cr layer and the SiNx film are etched to pattern the N⁺ a-Si:H for the ohmic contact layer 6 and the a-Si:H layer for the semiconductor activated layer 4. Polyimide is then applied as an insulating layer. A contact hole is formed by photolithographic and etching process, and Al layer 9 serving as line layer or shielding layer is formed by depositing Al on the polyimide insulating layer by the DC magnetron sputtering.

In the above structure of the conventional TFT, a coupling capacitance is generated between the source electrode of a TFT and the drain electrode of an adjacent TFT. The drain electrode is subject to large voltage variations where the distance between adjacent TFTs is sufficiently small. As a result, the source electrode of the adjacent TFT is subjected to corresponding voltage variations.

To overcome this problem, a ground line for shielding the adjacent TFTs has heretofore been provided to prevent interference by the drain electrode of a TFT with the source electrode of an adjacent TFT. However, attempts to increase the resolution of image sensors, have required that photoelectric conversion elements be densely mounted. In the case shown in the plan view of FIG. 5, no ground line can be interposed between adjacent TFTs, thereby making it difficult for high-resolution image sensors to prevent interference between adjacent TFTs.

SUMMARY OF THE INVENTION

The present invention has been made in view of the above circumstances and has as an object to provide a TFT with a structure capable of reducing interference between adjacent TFTs in a high-resolution image sensor without providing a ground line between the adjacent TFTs.

Additional objects and advantages of the invention will be set forth in part in the description which follows and in part will be obvious from the description, or may be learned by practice of the invention. The objects and advantages of the invention may be realized and attained by means of instrumentalities and combinations particularly pointed out in the appended claims.

To achieve the objects and in accordance with the purposes of the invention, as embodied and broadly described herein, the thin film transistor of the present invention comprises an insulating substrate, a gate electrode formed on the substrate, a first insulating layer formed on the gate electrode, a semiconductor layer formed on the first insulating layer over the gate electrode, a second insulating layer formed on the semiconductor layer over the gate electrode, a drain electrode having a predetermined width formed on the semiconductor layer and overlapping a side portion of the second insulating layer, a source electrode formed on the semiconductor layer opposing the drain electrode and overlapping another side portion of the second insulating layer, a third insulating layer formed on the source and the drain electrodes width, and a metallic layer formed on the third insulating layer having a width greater than the predetermined width and covering a predetermined length of the drain electrode.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

FIG. 3 is a plan view for a description of a thin film transistor, which is another embodiment of the invention;

FIG. 4 is a plan view for a description of a thin film transistor, which is still another embodiment of the invention;

DETAILED DESCRIPTION OF THE PREFERRED EMBODIMENTS

According to the first embodiment of the present invention, the metallic layer provided on the insulating layer for shielding the semiconductor layer in a TFT is formed with a width sufficient to cover the drain electrode. As a result, the coupling capacitance conventionally developed between the drain electrode of a TFT and the source electrode of an adjacent TFT is, instead, developed between the drain electrode and the metallic layer. The electric interference caused by the drain electrode of a TFT on the source electrode of an adjacent TFT is thereby reduced.

According to the second embodiment of the present invention, the metallic layer provided on the insulating layer for shielding the semiconductor layer in a TFT is formed with a width sufficient to cover both the drain and the source electrodes. As a result, the coupling capacitance conventionally developed between the drain electrode of a TFT and the source electrode of an adjacent TFT is developed between the drain electrode and the metallic layer. The electric interference caused by the drain electrode of a TFT on the source electrode of an adjacent TFT is thereby reduced. In addition, if a particular design requires that the capacitance of the source electrode be increased, the capacitance can be increased using the coupling capacitance generated between the source electrode and the metallic layer.

Figure 1:
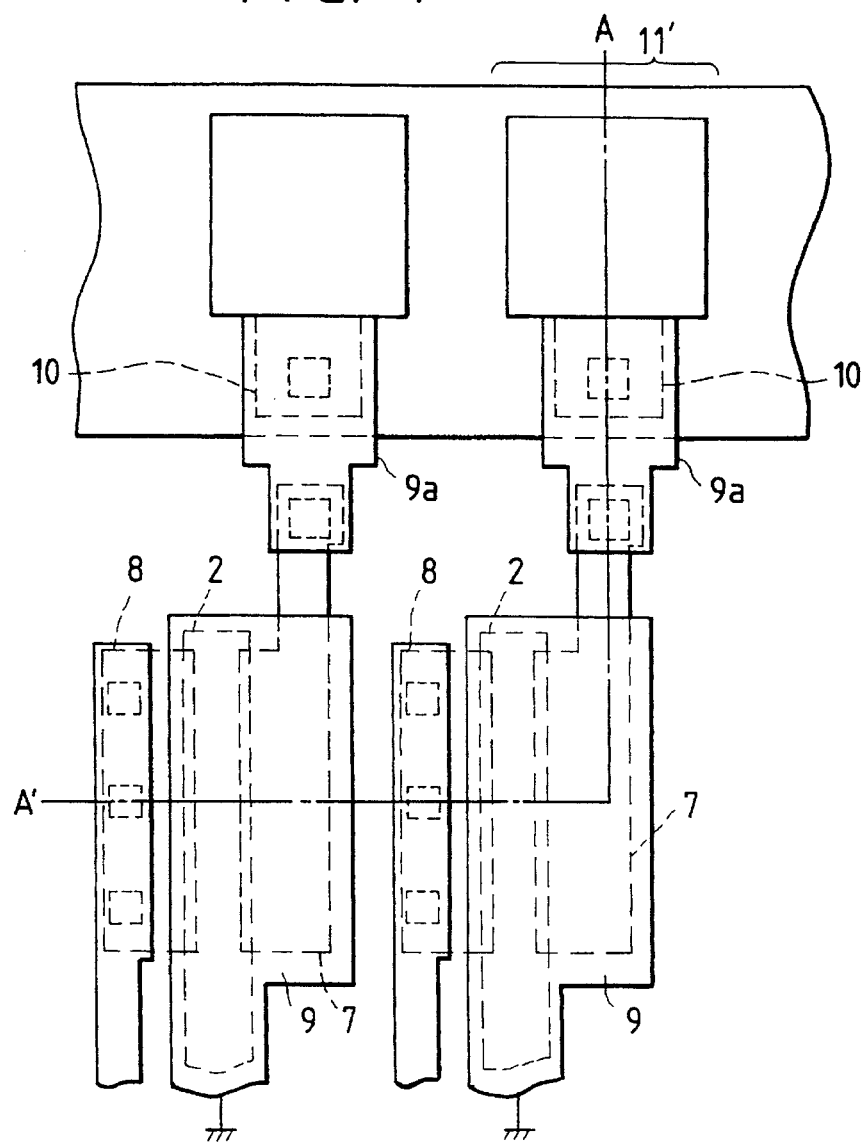
FIG. 1 is a plan view for a description of a thin film transistor which is an embodiment of the invention.
Figure 2:
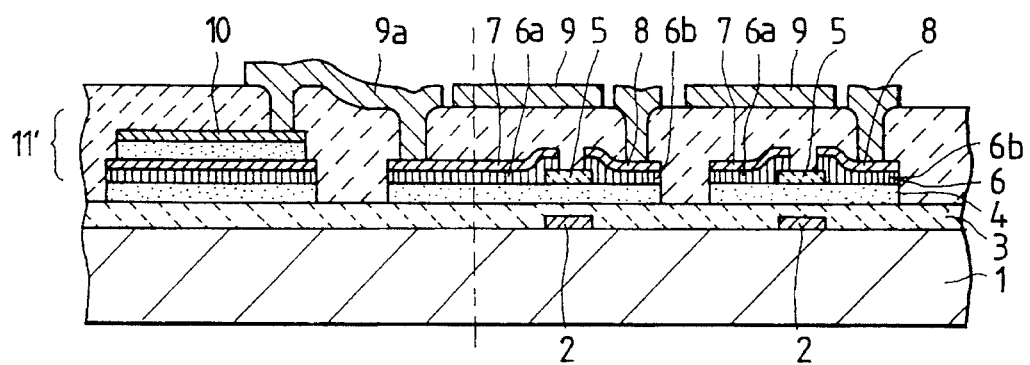
FIG. 2 is a sectional view for a description of a portion taken along a line A–A' shown in FIG. 1.
Figure 5:
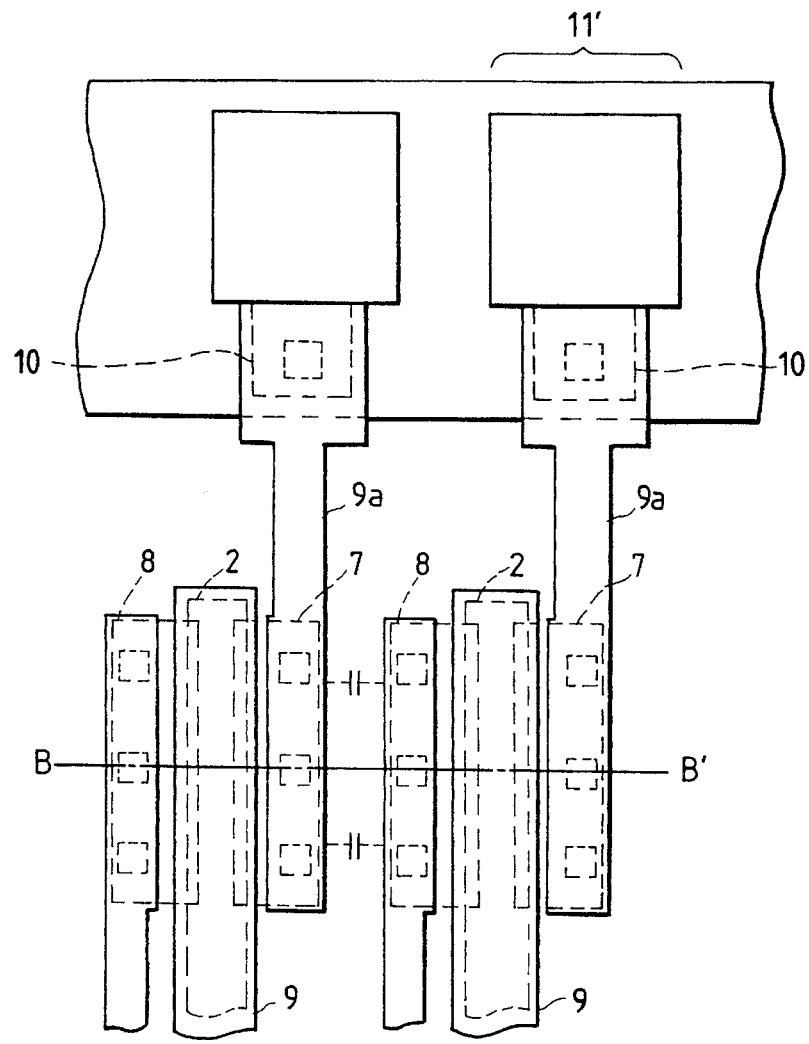
FIG. 5 is a plan view for a description of a conventional thin film transistor.
Figure 6:
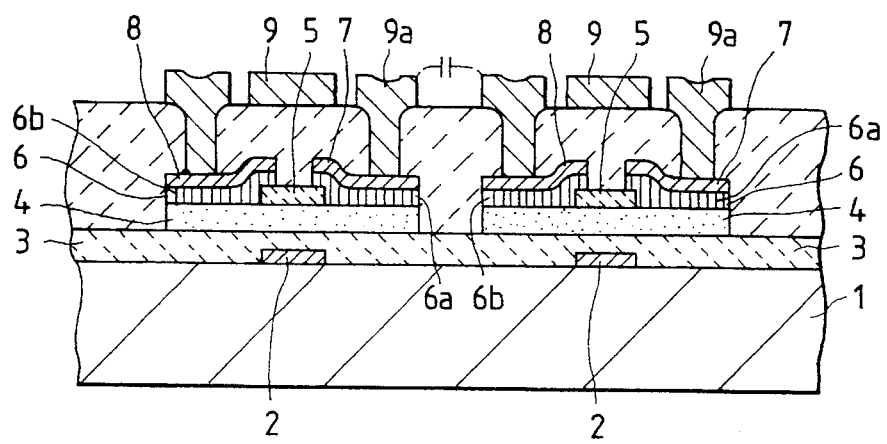
FIG. 6 is a sectional view for a description of a portion taken along a line B–B' shown in FIG. 5.
Figure 7:
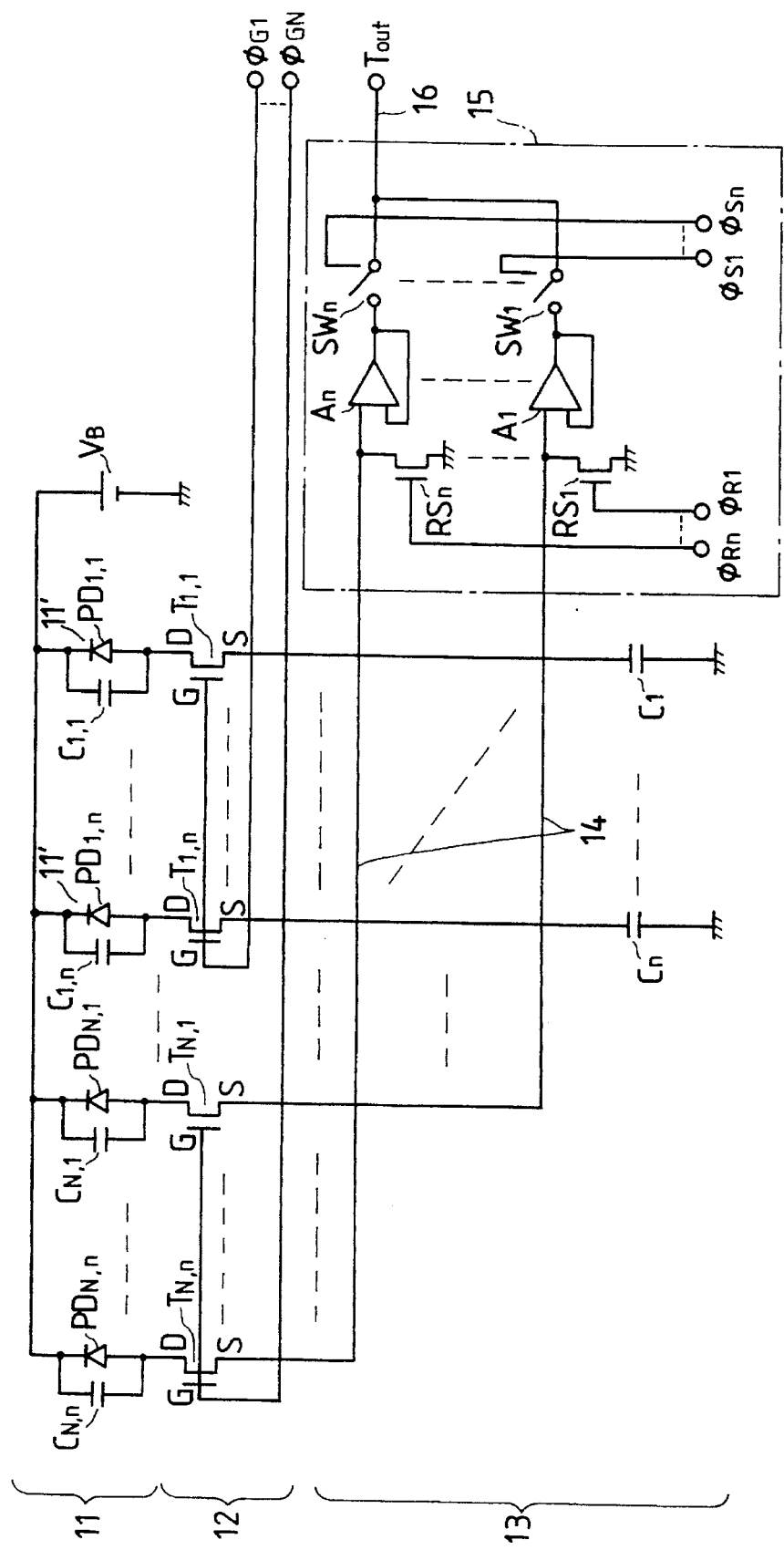
FIG. 7 is an equivalent circuit diagram for an image sensor.

FIG. 1 is a plan view illustrating a thin film transistor (TFT), which is a first embodiment of the present invention. FIG. 2 is a sectional view showing a portion taken along a line A–A' in FIG. 1. Like reference numerals in FIGS. 1 and 2 designate corresponding parts already described with respect to FIGS. 5 and 6.

A TFT, which is a first embodiment of the present invention, is a transistor having a reverse staggered structure which is formed by sequentially depositing on an insulating substrate 1 made of, e.g., glass or ceramic, a first chromium (Cr) layer serving as a gate electrode 2, a first silicon nitride (SiN) film serving as a gate insulating layer 3, an amorphous silicon hydride (a-Si:H) layer serving as a semiconductor activated layer 4, a second silicon nitride (SiN) film serving as a channel protection insulating film 5, an n+ hydride amorphous silicon (n+ a Si:H) layer serving as an ohmic contact layer 6, a second chromium (Cr) layer serving as a drain electrode 7 and a source electrode 8, and an aluminum (Al) layer 9 deposited through an insulating layer made of, e.g., polyimide. Ohmic contact layer 6 is separated into partial layer 6a, which is in contact with drain electrode 7, and partial layer 6b, which is in contact with source electrode 8. Cr2 layer formed thereon is similarly separated into drain electrode 7 and electrode 8.

As shown in FIGS. 1 and 2, Al layer 9 is provided above channel protection insulating film 5 and shields a-Si:H semiconductor activated layer 4. In this embodiment, Al layer 9 is formed to extensively cover the upper portion of drain electrode 7. Thus, unlike the conventional structure in which line 9a from transparent electrode 10 of photoelectric conversion element 11' is connected through a contact hole on drain electrode 7, the structure of the first embodiment of the present invention is such that part of Cr2 layer forming drain electrode 7 is extended towards the photoelectric conversion element 11' such that line 9a from transparent electrode 10 of the photoelectric conversion element 11' is connected thereto. Since the sectional view in FIG. 2 illustrates the TFT is taken at line A–A' in FIG. 1, the drain electrode 7 is not depicted as covered by Al layer 9. However, as is apparent from the plan view in FIG. 1, the upper portion of the drain electrode 7 is covered by Al layer 9 through the insulating layer made of, e.g., polyimide.

If Al layer 9 is formed with width greater than the width of drain electrode 7 so as to overlap and extend outwardly beyond drain electrode 7, then a large part of the coupling capacitance typically developed between the drain electrode 7 of a TFT and the source electrode 8 of an adjacent TFT will be developed between drain electrode 7 and Al layer 9. The interference caused by voltage variations in the drain electrode 7 of a TFT on the source electrode 8 of an adjacent TFT can thereby be prevented. In other words, Al layer 9, which is either grounded or maintained at a certain potential, serves as a shield.

A method of preparing the TFT according to the first embodiment of the present invention will be described with reference to FIGS. 1 and 2.

Cr1 layer serving as the gate electrode 2 is deposited on an inspected and cleaned substrate 1 made of, e.g., glass, to a thickness of about 750 Å at a temperature of about 150° C. by a DC sputtering method. The first chromium (Cr) layer is then subjected to a photolithographic process and an etching process to pattern gate electrode 2. The first chromium (Cr) layer thus processed is then subjected to an alkaline cleaning process.

Gate insulating layer 3, semiconductor activated layer 4 and channel protection insulating layer 5 of the TFT are respectively formed on the first chromium (Cr) pattern on the first silicon nitride (SiN) film, an a-Si:H film, and the second silicon nitride (SiN) film by continuously depositing to thicknesses of about 3000 Å, about 500 Å and about 1500 Å, respectively, by a plasma chemical vapor deposition (P-CVD) method while maintaining a vacuum. The continuous deposition process under a vacuum prevents interfacial contamination, thus contributing to stabilizing TFT performance.

The preferred P-CVD conditions for forming the first silicon nitride (SiN) film for gate insulating layer 3 are: a substrate temperature of 350° C.; $SiH_4$ and $NH_3$ pressures of 0.1 to 0.5 Torr; an $SiH_4$ flow rate of 10 to 50 sccm; an $NH_3$ flow rate of 100 to 300 sccm; an a radio frequency (RF) power of 50 to 200 W.

The preferred PC-CVD conditions for forming the a-Si:H film for semiconductor activated layer 4 are: a substrate temperature of 275° C.; an $SiH_4$ pressure of 0.1 to 0.5 Torr; an $SiH_4$ flow rate of 100 to 300 sccm; an RF power of 50 to 200 W.

The preferred P-CVD conditions for forming the second silicon nitride (SiN) film for channel protection insulating layer 5 are: a substrate temperature of 275° C.; $SiH_4$ and $NH_3$ pressures of 0.1 to 0.5 Torr; an $SiH_4$ flow rate of 10 to 50 sccm; an $NH_3$ flow rate of 100 to 300 sccm; and an RF power of 50 to 200 W.

To pattern gate insulating layer 3 in a form corresponding to gate electrode 2, resist is applied to the surface of gate insulating layer 3. The treated surface of insulating layer 3 is then exposed, developed using a photolithographic mask, etched using a mixed solution of HF and $NH_4F$, and the resist is then separated therefrom.

The first chromium (Cr) layer thus far processed is then subjected to a BHF process, and the n+ a-Si:H film is deposited thereon to a thickness of about 1000Å at about 250° C. as ohmic contact layer 6 by the P-CVD method. Then, a second chromium (Cr) layer for the drain electrode 7 and source electrode 8 of the TFT is deposited to a thickness of about 1500Å by DC magnetron sputtering.

Using a photolithographic mask to form the drain electrode 7 and source electrode 8, the second chromium (Cr) layer thus processed is exposed and developed by photolithography to form a resist pattern, subjected to an etching process using a mixed solution of ammonium cerium nitrate, perchloric acid and water, patterned, and the resist is separated therefrom. During this patterning process, a pattern for that part of drain electrode 7 extending towards the photoelectric conversion element 11' is provided.

The second chromium (Cr) layer thus far processed is dry-etched using a mixed gas of $CF_4$ and $O_2$, the second chromium (Cr) layer and the silicon nitride (SiN) portion remain unetched, while the n+ a-Si:H layer for ohmic contact layer 6 and the a-Si:H layer for semiconductor activated layer 4, both layers having no second chromium (Cr) layer and silicon nitride (SiN) portion, are removed by etching. As a result, a pattern for semiconductor activated layer 4 is provided, and, in addition, ohmic contact layer 6 is patterned into partial layer 6a corresponding to drain electrode 7 and partial layer 6b corresponding to source electrode 8. A polyimide film is then applied to a thickness of about 13,000Å to cover the entire part of an image sensor, prebaked at about 160° C., patterned by the photolithographic and etching process, and rebaked.

Al layer 9 is deposited to a thickness of about 15,000 Å at about 150° C. to cover the entire part of the TFT by the DC magnetron sputtering, and subjected to a photolithographic and etching process to obtain a pattern wherein Al layer 9 is wider than drain electrode 7 and covers the upper portion of drain electrode 7. Accordingly, Al layer 9 shields the a-Si:H layer and checks the interference attributable to variations in the voltage of drain electrode 7.

According to the TFT of this embodiment, Al layer 9, which is arranged above channel protection insulating film 5 on semiconductor activated layer 4 to shield the semiconductor activated layer 4 made of a-Si:H, is formed with a width to cover and extend beyond the width of drain electrode 7. As a result, even in cases where no ground line is provided between adjacent TFTs, coupling capacitance, which has heretofore been generated between the drain electrode 7 of a TFT and the source electrode 8 of an adjacent TFT and which has caused voltage variations in the drain electrode 7 to interfere with the source electrode 8, is now generated between drain electrode 7 and Al layer 9. The introduction of an Al layer 9 having a wider width allows the Al layer 9 to accommodate voltage variations on drain electrode 7. This provides the advantage of reducing the interference between drain electrode 7 of a TFT with the source electrode 8 of an adjacent TFT.

Al layer 9 is not arranged above the entire width of source electrode 8 in this embodiment in order to prevent reduction in the sensitivity of the image sensor. That is, the addition of superfluous capacitance between source electrode 8 and Al layer 9 would increase the capacitance of the element receiving the transferred electric charge, thereby impairing the transfer efficiency and reducing the difference between output potentials. This eventually leads to reduction in the sensitivity of the image sensor.

A second embodiment of the present invention is shown in FIG. 3. In this embodiment, Al layer 9 is formed extensively over both drain electrode 7 and source electrode 8 to cover both electrodes. Al layer 9 may be either grounded or maintained at a constant potential. As a result, this structure provides the same advantage of reducing the interference caused by voltage variations in drain electrode 7 of a TFT on the source electrode 8 of an adjacent TFT as in the previously described embodiment. In addition, this second embodiment accommodates the need for adding capacitance to source electrode 8 in the form of a coupling capacitance developed between Al layer 9 and source electrode 8.

A third embodiment of the present invention is shown in FIG. 4. In this embodiment, Al layer 9 is not formed over the entire width of drain electrode 7 but is formed extensively over source electrode 8 so as to cover source electrode 8. Al layer 9 may be either grounded or maintained at a constant potential. Such a TFT structure is effective in cases where a particular design requires a drain electrode 7 having less capacitance or where electrostatic breakdown between drain electrode 7 and Al layer 9 must be prevented. Since the distance between drain electrode 7 and the Al layer 9 extending outwardly so as to cover the upper portion of the source electrode 8 is less than the distance between drain electrode 7 and source electrode 8 of an adjacent TFT, the drain electrode 7 serves as a shield. This provides the advantage of reducing the interference caused by voltage variations in drain electrode 7 with the source electrode 8 of an adjacent TFT.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A thin film transistor array having a plurality of thin film transistors arranged on a substrate, each of said plurality of thin film transistors comprising:

a gate electrode formed on said substrate;

a first insulating layer formed on said gate electrode;

a semiconductor layer formed on said first insulating layer over said gate electrode;

a second insulating layer formed on said semiconductor layer over said gate electrode;

a drain electrode having a first predetermined width formed on said semiconductor layer and overlapping a side portion of said second insulating layer;

a source electrode having a second predetermined width formed on said semiconductor layer opposing said drain electrode and overlapping another side portion of said second insulating layer;

a third insulating layer formed on said source electrode and said drain electrode; and a metallic layer formed on said third insulating layer having a width greater than said first predetermined width and covering a predetermined length of said drain electrode, but not covering the entire second predetermined width of the source electrode;

wherein the drain electrode of one of two adjoining thin film transistors of the plurality of thin film transistors is adjoining to the source electrode of the other of said two adjoining thin film transistors, and part of the drain electrode of each of the plurality of thin film transistors extends in only one direction different from a direction of arrangement of said transistors.

2. A thin film transistor array having a plurality of thin film transistors arranged on a substrate, each of said plurality of thin film transistors comprising:

a gate electrode formed on said substrate;

a first insulating layer formed on said gate electrode;

a semiconductor layer formed on said first insulating layer over said gate electrode;

a second insulating layer formed on said semiconductor layer over said gate electrode;

a source electrode having a first predetermined width formed on said semiconductor layer and overlapping a side portion of said second insulating layer;

a drain electrode having a second predetermined width formed on said semiconductor layer opposing said source electrode and overlapping another side portion of said second insulating layer;

a third insulating layer formed on said source electrode and said drain electrode; and a metallic layer formed on said third insulating layer having a width greater than said first predetermined width and covering a predetermined length of said source electrode, but not covering the entire second predetermined width of the drain electrode;

wherein the drain electrode of one of two adjoining thin film transistors of the plurality of thin film transistors is adjoining to the source electrode of the other of said two adjoining thin film transistors, and part of the drain electrode of each of the plurality of thin film transistors extends in only one direction different from a direction of arrangement of said transistors.

3. A thin film transistor comprising:

an insulated substrate;

a gate electrode on said substrate, said gate electrode having a first width and a first length, wherein said first width is measured in a direction orthogonal to said first length, and wherein said first length is measured between a first end portion and a second end portion of said gate electrode;

a first insulating layer on said insulated substrate overlaying said gate electrode;

a semiconductor layer on said first insulating layer over said gate electrode;

a second insulating layer on said semiconductor layer overlaying said gate electrode;

a drain electrode having a second width and a second length, wherein said second width is measured in a direction orthogonal to said second length, and wherein said second length is measured between a first end portion and a second end portion of said drain electrode, said drain electrode being disposed on said semiconductor layer and overlapping a side portion of said first width of said gate electrode;

a source electrode having a third width and a third length, wherein said third width is measured in a direction orthogonal to said third length, and wherein said third length is measured between a first end portion and a second end portion of said source electrode, said source electrode being disposed on said semiconductor layer opposing said drain electrode and overlapping another side portion of said gate electrode;

a third insulating layer on said source electrode and said drain electrode; and a metallic layer on said third insulating layer overlaying said first width of said gate electrode along a portion of said first length proximate said first end portion of said gate electrode, and overlaying said entire second width of said drain electrode along a portion of said second length proximate said second end portion of the drain electrode, and wherein the metallic layer does not overlay the entire third width of the source electrode.

4. A thin film transistor comprising:

an insulated substrate;

a gate electrode on said substrate, said gate electrode having a first width and a first length, wherein said first width is measured in a direction orthogonal to said first length, and wherein said first length is measured between a first end portion and a second end portion of said gate electrode;

a first insulating layer on said insulated substrate overlaying said gate electrode;

a semiconductor layer on said first insulating layer over said gate electrode;

a second insulating layer on said semiconductor layer overlaying said gate electrode;

a drain electrode having a second width and a second length, wherein said second width is measured in a direction orthogonal to said second length, and wherein said second length is measured between a first end portion and a second end portion of said drain electrode, said drain electrode being disposed on said semiconductor layer and overlapping a side portion of said first width of said gate electrode;

a source electrode having a third width and a third length, wherein said third width is measured in a direction orthogonal to said third length, and wherein said third length is measured between a first end portion and a second end portion of said source electrode, said source electrode being disposed on said semiconductor layer opposing said drain electrode and overlapping another side portion of said gate electrode;

a third insulating layer on said source electrode and said drain electrode; and a metallic layer on said third insulating layer overlaying said first width of said gate electrode along a portion of said first length proximate said first end portion of said gate electrode, and overlaying said entire third width of said source electrode along a portion of said third length proximate said first end portion of said source electrode, and wherein the metallic layer does not overlay the entire second width of the drain electrode.

5. A semiconductor device comprising:

an insulated substrate;

a gate electrode on said substrate, said gate electrode having a first width and a first length, wherein said first width is measured in a direction orthogonal to said first length, and wherein said first length is measured between a first end portion and a second end portion of said gate electrode;

a first insulating layer on said insulated substrate overlaying said gate electrode;

a semiconductor layer on said first insulating layer over said gate electrode;

a second insulating layer on said semiconductor layer overlaying said gate electrode;

a drain electrode having a second width and a second length, wherein said second width is measured in a direction orthogonal to said second length, and wherein said second length is measured between a first end portion and a second end portion of said drain electrode, said drain electrode being disposed on said semiconductor layer and overlapping a side portion of said first width of said gate electrode;

a source electrode having a third width and a third length, wherein said third width is measured in a direction orthogonal to said third length, and wherein said third length is measured between a first end portion and a second end portion of said source electrode, said source electrode being disposed on said semiconductor layer opposing said drain electrode and overlapping another side portion of said gate electrode;

a third insulating layer on said source electrode and said drain electrode;

a metallic layer on said third insulating layer overlaying said first width of said gate electrode along a portion of said first length proximate said first end portion of said gate electrode, and overlaying said entire second width of said drain electrode along a portion of said second length proximate said second end portion of the drain electrode, and wherein the metallic layer does not overlay the entire third width of the source electrode; and a photoelectric conversion element, wherein said first end portion of said drain electrode is ohmically connected to said photoelectric conversion element.

6. The thin film transistor of claim 5, wherein said photoelectric conversion element includes a transparent electrode ohmically connected to said first end portion of said drain electrode.

7. A semiconductor device comprising:

an insulated substrate;

a gate electrode on said substrate, said gate electrode having a first width and a first length, wherein said first width is measured in a direction orthogonal to said first length, and wherein said first length is measured between a first end portion and a second end portion of said gate electrode;

a first insulating layer on said insulated substrate overlaying said gate electrode;

a semiconductor layer on said first insulating layer over said gate electrode;

a second insulating layer on said semiconductor layer overlaying said gate electrode;

a drain electrode having a second width and a second length, wherein said second width is measured in a direction orthogonal to said second length, and wherein said second length is measured between a first end portion and a second end portion of said drain electrode, said drain electrode being disposed on said semiconductor layer and overlapping a side portion of said first width of said gate electrode;

a source electrode having a third width and a third length, wherein said third width is measured in a direction orthogonal to said third length, and wherein said third length is measured between a first end portion and a second end portion of said source electrode, said source electrode being disposed on said semiconductor layer opposing said drain electrode and overlapping another side portion of said gate electrode;

a third insulating layer on said source electrode and said drain electrode; and a metallic layer on said third insulating layer overlaying said first width of said gate electrode along a portion of said first length proximate said first end portion of said gate electrode, and overlaying said entire third width of said source electrode along a portion of said third length proximate said first end portion of said source electrode, and wherein the metallic layer does not overlay the entire second width of the drain electrode; and a photoelectric conversion element, wherein said first end portion of said drain electrode is ohmically connected to said photoelectric conversion element.

8. The thin film transistor of claim 7, wherein said photoelectric conversion element includes a transparent electrode ohmically connected to said first end portion of said drain electrode.

* * * * *